United States Patent [19]

Davidson et al.

[11] 4,015,147
[45] Mar. 29, 1977

[54] LOW POWER TRANSMISSION LINE TERMINATOR

[75] Inventors: Evan E. Davidson, Hopewell Junction; Ralph D. Lane, Wappingers Falls, both of N.Y.

[73] Assignee: International Business Machines Corporation, Armonk, N.Y.

[22] Filed: Sept. 8, 1975

[21] Appl. No.: 611,462

Related U.S. Application Data

[63] Continuation of Ser. No. 483,269, June 26, 1974, abandoned.

[52] U.S. Cl. .............................. 307/304; 307/208; 307/237; 307/270; 307/317 A; 333/22 R; 357/15; 357/42

[51] Int. Cl.² ................ H01L 27/04; H01L 29/48; H03K 5/08; H01P 1/26

[58] Field of Search .......... 307/205, 208, 237, 251, 307/270, 317 A, 213; 357/42, 43, 15; 333/17 L, 20, 22 R, 81 R

[56] References Cited

UNITED STATES PATENTS

| | | | |
|---|---|---|---|
| 3,573,509 | 4/1971 | Crawford | 307/303 |
| 3,667,009 | 5/1972 | Rugg | 357/42 |
| 3,673,428 | 6/1972 | Athanas | 357/42 X |
| 3,712,995 | 1/1973 | Steudel | 357/42 X |
| 3,725,790 | 4/1973 | Ault et al. | 307/208 X |
| 3,739,238 | 6/1973 | Hara | 357/42 |
| 3,806,371 | 4/1974 | Barone | 357/42 X |
| 3,812,520 | 5/1974 | Baker | 357/43 |
| 3,832,575 | 8/1974 | Dasgupta et al. | 307/208 |

FOREIGN PATENTS OR APPLICATIONS

| | | | |
|---|---|---|---|
| 280,704 | 4/1965 | Australia | 307/208 |

OTHER PUBLICATIONS

Garrett, "Integrated–Circuit Digital Logic Families," *IEEE Spectrum*, vol. 7, No. 12; 12/1970; pp. 30–42.
Dachtera, "Schottky Diode Line Terminator;" *IBM Tech. Discl. Bull;* vol. 12, No. 11, 4/1970; pp. 1861; 4/1970.
Palmieri et al., "Linear Termination Network for a Transmission Line Semiconductor Circuit," *IBM Tech. Discl. Bull.;* vol. 12, No. 11, 4/1970; pp. 1762.

*Primary Examiner*—John S. Heyman
*Assistant Examiner*—Larry N. Anagnos
*Attorney, Agent, or Firm*—Theodore E. Galanthay

[57] ABSTRACT

Disclosed is a terminator for a transmission line including first and second diodes connected in a series path having a common node therebetween connected to the transmission line. A potential supply connected across the terminal ends of the series connected diodes reverse biases them into their high impedance state.

5 Claims, 13 Drawing Figures

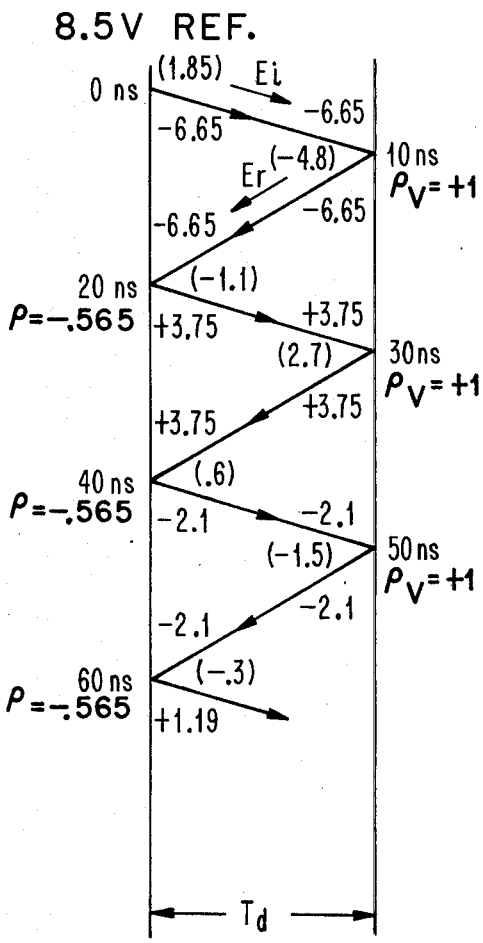
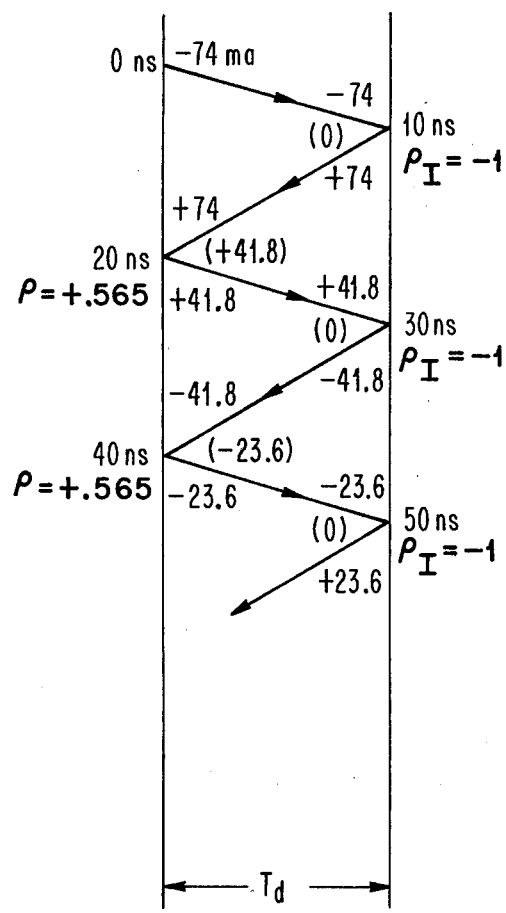
PRIOR ART
FIG. 7A
PRIOR ART
FIG. 7B

LOW POWER TRANSMISSION LINE TERMINATOR

This is a continuation of application Ser. No. 483,269, filed June 26, 1974, now abandoned.

BACKGROUND OF THE INVENTION

1. Field of the Invention

This invention relates to a low power transmission line terminator and more particularly to a non-linear transmission line terminator dissipating less power than linear terminators.

2. Description of the Prior Art

In the prior art, circuits such as complementary field effect transistor circuits (CFET) have transmission lines normally terminated by the input gate capacitance of the field effect transistors that are being driven. This gate capacitance is usually sufficiently low such that the transmission line acts as if it were terminated by an open circuit. With an open circuit, the power dissipated by the driving circuit is low but voltage reflections from the far end can cause field effect transistor (FET) substrate junctions to be forward biased. In an open circuit termination, a negative going voltage at the far end receiving terminal is doubled by the reflected wave. This negative reflected transition then travels back to the near end sending terminal. When it reaches the near end, the reflected wave can cause the sending terminal node to drop below ground potential causing the substrate junction to be forward biased. This can cause the complete circuit to be inoperative because of a phenomenon known as the "Silicon Controlled Rectifier" effect.

In order to avoid transmission lines reflection and resultant distorted wave forms, the prior art traditionally terminates a transmission line in its characteristic impedance. This classical solution is not adaptable to the semiconductor integrated structures described herein because of the excessive power dissipated by a resistive termination. Moreover, in integrated circuit technology, resistors tend to occupy excessive space on a semiconductor chip.

SUMMARY OF THE INVENTION

Accordingly, it is a primary object of this invention to provide an improved transmission line terminator.

It is another object of this invention to provide a non-linear transmission line terminator dissipating minimal power.

It is still another object of this invention to provide a transmission line terminator for integrated logic circuits constructed in accordance with monolithic technology.

It is a further object of this invention to provide an improved semiconductor structure for a transmission line terminator.

It is a still further object of this invention to eliminate the forward biasing of the substrate in monolithically constructed integrated logic circuits.

In accordance with the present invention, first and second non-linear impedance devices, such as diodes, are connected in a series path having a common node therebetween and connected to the far end receiving terminal of the transmission line. A potential supply connected across the terminal ends of the diodes reverse biases them into their high impedance state. Diodes connected in this manner provide an infinite impedance when the potential at the far end is in a desirable range. Thus, there can be no adverse effect on the performance of the circuit. However, when the voltage at the far end is outside the limits of the desirable range, the impedance of the terminator drops significantly preventing undesirably large voltage swings to be reflected back to the near end.

In integrated circuit technology, the terminated diodes may be formed from Schottky barrier diodes, exploiting their lower forward drop. The diodes can also be of diffused junction type. If the transmission line terminator is to consist of one diode of each type, then the Schottky barrier diode is made larger than the pn junction diode to compensate for the high resistivity of the n-substrate with respect to the diffusion pocket.

The foregoing and other objects, features, and advantages of the invention will be apparent from the following and more particular description of preferred embodiments of the invention, as illustrated in the accompanying drawings.

IN THE DRAWINGS

FIG. 7A is a voltage plot of the transmission line characteristics of a prior art circuit without the presently disclosed transmission line terminator.

FIG. 7B is a current plot of a prior art circuit without the transmission line terminator of the present invention.

GENERAL DESCRIPTION

Figure 1:
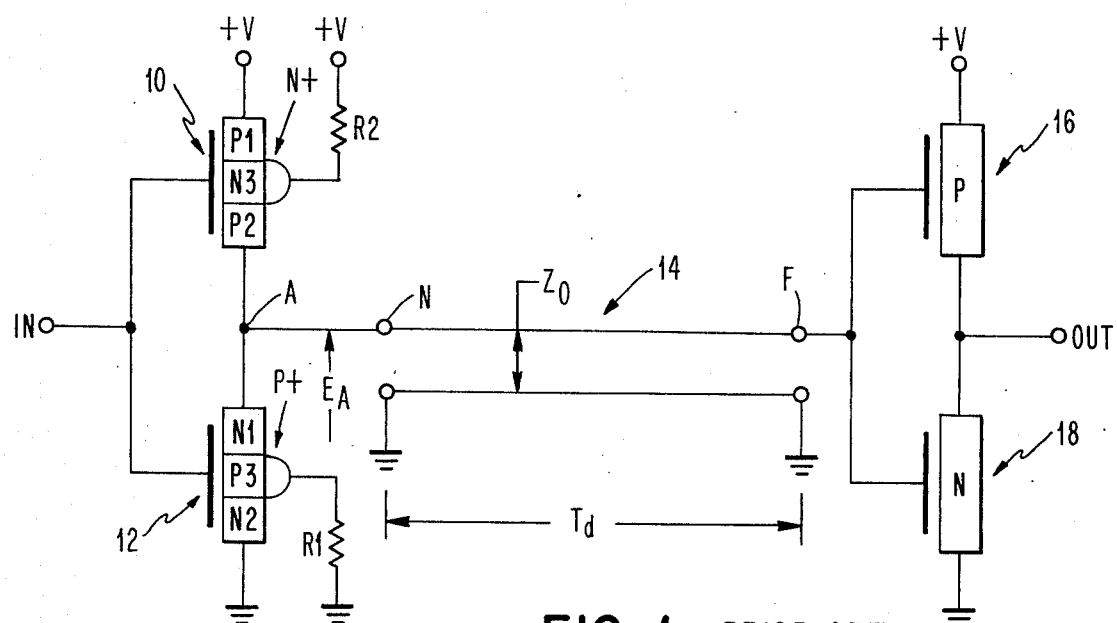
FIG. 1 is a schematic circuit diagram of a prior art complementary field effect transistor configuration.
Figure 2:
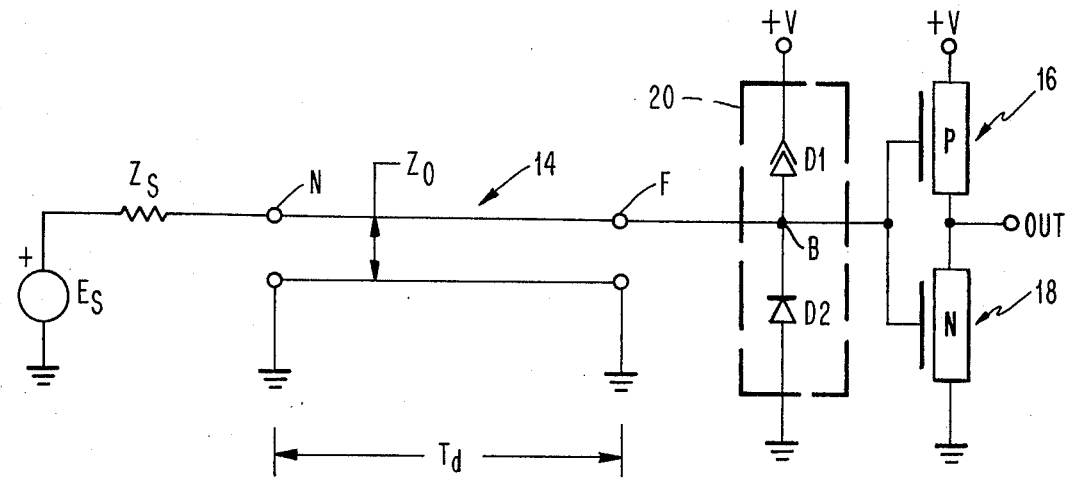
FIG. 2 is a schematic circuit diagram of a preferred embodiment of the present invention.

Referring now to FIG. 1 there is illustrated a complementary field effect transistor (CFET) circuit. A driving circuit at the near end, (or sending end) of the transmission line consists of p channel transistor 10 and n channel transistor 12. The source of transistor 10 designated as P1 is connected to the +V potential supply. The substrate N3 includes a substrate contact diffusion N+ which is also connected to the +V potential through a high resistance R2. The drain P2 of transistor 10 is connected to a common point (node A) with the drain N1 of transistor 12. The substrate P3 of transistor 12 includes a P+ substrate contact diffusion which is connected to ground potential through a high resistance R1. The source N2 of transistor 12 is connected to ground potential. The gate electrodes of these two transistors are connected in common to an input terminal. An input signal appearing on the input terminal is inverted by the circuit and applied to the transmission line 14. The length of the transmission line varies of course with the particular application desired and has its length labeled Td to indicate the time required for a signal to propagate down the tranmission line. Assuming, for example, a propagation rate of 2 nanoseconds per foot, would result in Td being 8 nanoseconds for a 4 foot transmission line. The propagated signal arrives at the far end of receiving terminals F and is typically applied to the gate electrode of one or more field effect transistors illustrated for purposes of example by p channel transistor 16 and n channel transistor 18 connected in series as previously described transistors 10 and 12. The capacitance of the gate electrodes 16 and 18 is sufficiently low such that the transmission line acts as if it were terminated by an open circuit such that the signal is reflected back down transmission line 14 to the near end terminal N and all points to the left thereof connected to the same electrical conductor.) Except for the terminator 20, FIG. 2 is substantially identical to the prior art FIG. 1 and corresponding elements have been correspondingly numbered insofar as practical. The inverter circuit consisting of transistors 10 and 12 has been replaced by its equivalent circuit of a potential source Es and its characteristic impedance Zs for facilitating the description of the operation of this circuit. In the FIG. 2 embodiment a signal propagated down transmission line 14 is not terminated in an open circuit but rather by the terminator 20. Terminator 20 consists of first and second diodes D1 and D2 connected in a series path having a common node B therebetween connected to the transmission line 14. A potential supply is connected across the terminal end of diodes D1 and D2 to reverse bias them. Accordingly, potential +V is connected to the cathode of diode D1 while the anode of D2 is connected to ground potential.

Figure 4:
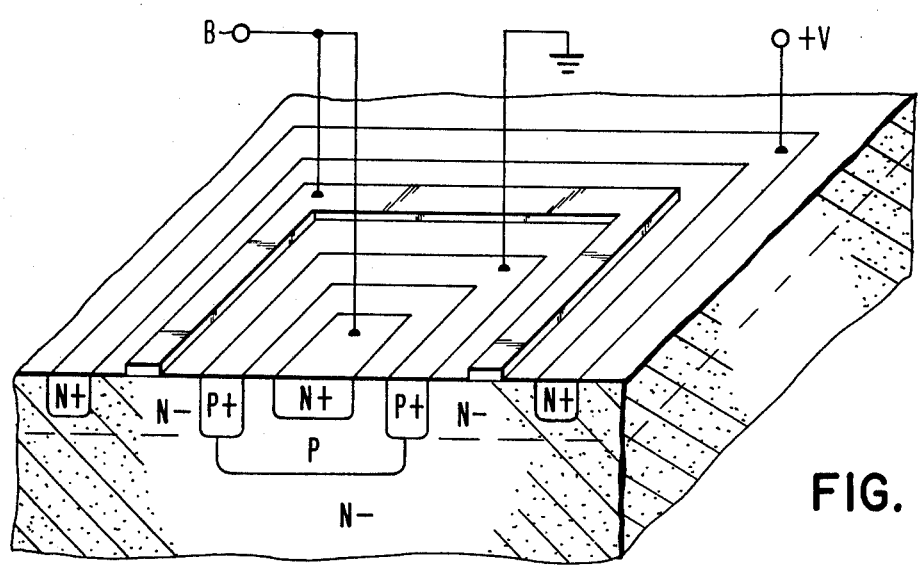
FIG. 4 is a perspective cross sectional view of the present invention embodied in integrated semiconductor technology.

Refer now to FIG. 4 for a structural representation of the diode terminator 20 in integrated circuit form. Into the illustrated N− substrate there is diffused a p region pocket with a P+ contact ring. This P+ contact ring is connected to ground, the p pocket forming the anode of diode D2. Into the p pocket there is diffused an N+ region which forms the cathode of diode D2 which is connected to node B. Node B is also connected to the metal strip forming the anode of diode D1. The N− substrate forms the cathode of diode D1 which is connected to the +V potential through the illustrated N+ diffusion ring. Such a structure formed into a portion of a semiconductor chip provides the diode terminator circuit of the present invention.

Figure 5:
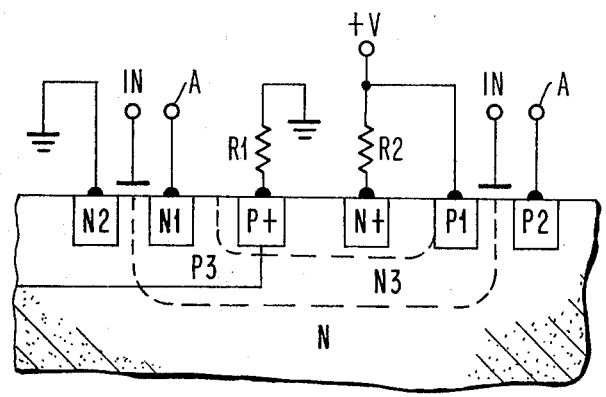
FIG. 5 is a cross section of a semiconductor structure illustrating a particular problem solved by the present invention.

Refer now to FIG. 5 illustrating the integrated structural form of the transistors 10 and 12 illustrated in FIG. 1. The n channel FET 12 has its source diffusion N2 connected to the ground potential. The drain diffusion N1 of FET 12 is electrically connected to node A. The gate electrode of FET 12 is formed over the channel region between diffusions N1 and N2 in the P type pocket P3 diffused into the n-type substrate. Contact diffusion P+ makes contact to diffused pocket P3 which is connected to ground through high resistance R1. The drain diffusion P2 of transistor 10 is also connected to node A as per the FIG. 1 drawing. The source diffusion P1 of transistor 10 is connected to a +V potential also as per FIG. 1. Similarly, the gate electrode of transistor 10 is connected to the input node. The channel region between diffusions P1 and P2 substantially under the gate electrode is formed from the n-type substrate materials. Contact to this n-type substrate material is made by diffusion N+ which is connected to the +V potential through the high resistance R2. Note the dotted lines in FIG. 5 which help in illustrating the potential parasitic silicon rectifier device that is formed when the desired circuit arrangement is formed in a dense packaging configuration. Resistances R2 and R1 are caused by the resistivity of diffusions that are used for connecting the substrate and pocket to +V and ground, respectively.

Figure 6:
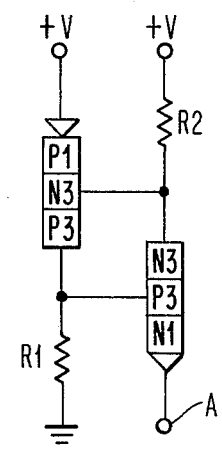
FIG. 6 is a schematic circuit diagram equivalent of the parasitic circuit resulting from the structure illustrated in FIG. 5.

With continued reference to FIG. 5, also refer to FIG. 6 which is a circuit equivalent of the parasitic circuit resulting from the structure illustrated in FIG. 5. Those skilled in the art will recognize the circuit of FIG. 6 as the circuit equivalent of a four layer PNPN silicon controlled rectifier structure. As the two FET's 10 and 12 are placed in close proximity, transistor action is found to occur between regions N1, P3, and N3 where the P3 region becomes the base of the NPN transistor. Transistor action becomes increasingly prevalent as the distance between the N1/P3 junction and the N3/P3 junction are decreased. Further transistor action is noted in the form of a PNP transistor including regions P1, N3 and P3 where as the distance between the P1/N3 and P3/N3 junctions is reduced, a PNP transistor is formed. The circuit configuration of FIG. 6 is known to perform a latching function which renders the circuit arrangement of transistors 10 and 12 inoperative. Such a problem is partially alleviated by providing resistances R1 and R2 in the order of 100 ohms by connecting the substrate to a potential level with a minimum of interconnection resistance. However, if node A receives an input more negative than ground potential, the NPN transistor can conduct. This permits the N3 region to be brought below +V potential causing the PNP transistor also to conduct, thereby completing the latching function. As will be explained in greater detail herein, this condition is specifically prevented by the present invention.

Figure 9:
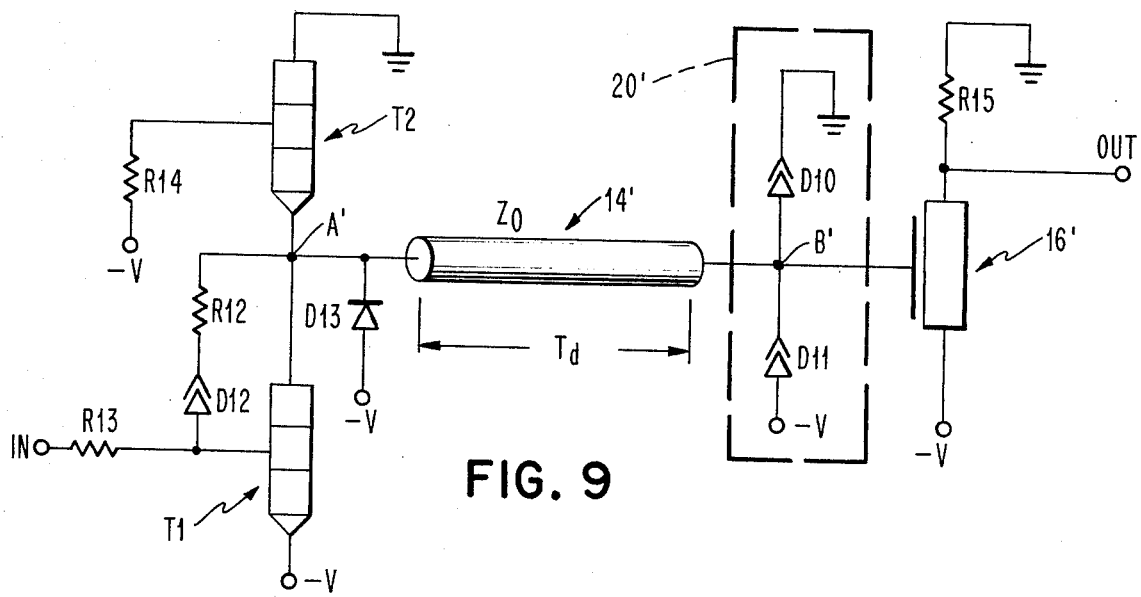
FIG. 9 is a schematic circuit diagram of an alternate embodiment of the present invention.

Refer now to FIG. 9 which shows an alternate embodiment of the present invention in which bipolar transistors are utilized to drive the gate of a field effect transistor through a transmission line. NPN transistors T1 and T2 are connected in series as shown. Schottky diode D12 is connected in series with resistor R12 forming a clamp for T1. Resistor R13 is connected between the input terminal and the base of T1 while R14 is connected between the −V potential and the base of T2. The common node has been labelled A' to correspond to node A in FIG. 1. Isolation diode D13 is connected between node A' and the −V potential. The foregoing is not intended to represent a unique circuit, but rather one example of a number of bipolar circuits that might be used to drive a signal through a transmission line 14'. The driven device represented by transistor 16' is connected to the far end of the transmission line, node B', and is in a series path between ground potential, resistor R15, and the −V potential. The nonlinear terminator 20' consists of series diodes D10 and D11 illustrated as Schottky barrier diodes. Although the low forward voltage drop characteristic of Schottky diodes is advantageous, diffused diodes could also satisfactory perform the desired function.

Figure 10:
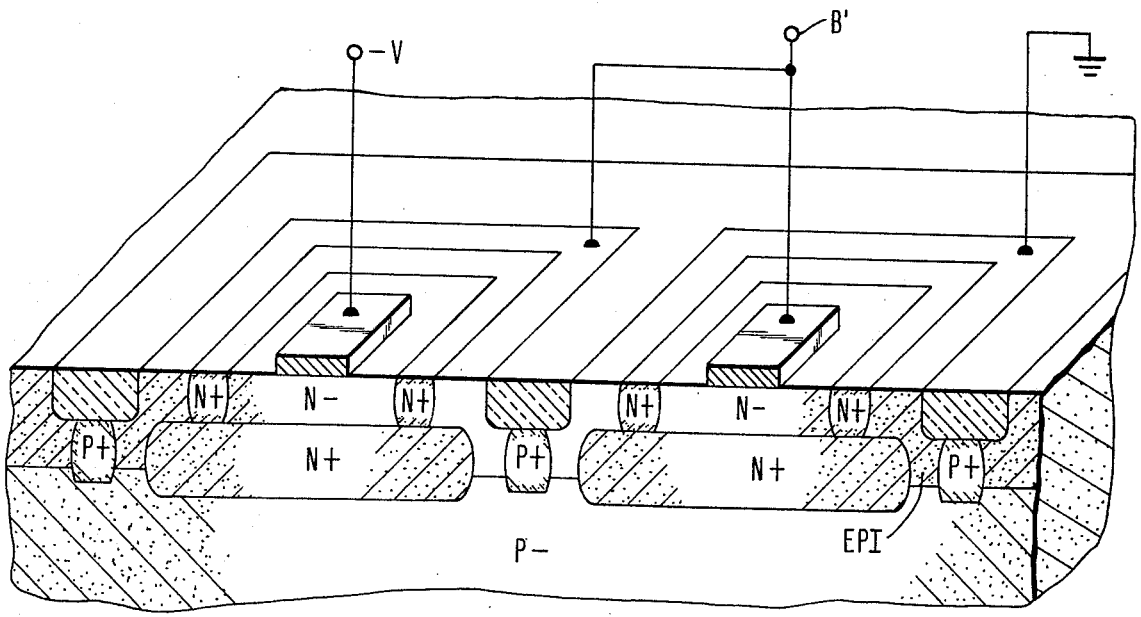
FIG. 10 is a perspective cross sectional view of an integrated semiconductor structure of the FIG. 9 embodiment.

Refer now to FIG. 10 which illustrates one embodiment in which the diode terminator 20' can be implemented. A P-type substrate has formed therein both P+ and N+ type diffusion pockets and an epitaxial layer into which said pockets are diffused. The P+ isolation pockets may be extended to the surface or recessed oxide formed from the epitaxial silicon may be used to complete the isolation. To this point, the structure is well known to those skilled in the art for forming isolated silicon regions. In accordance with the present structure, an N+ contact region is diffused to make contact with each of the isolated N- regions. These N-regions form the cathodes of each of the diodes D10 and D11, while the anodes are formed by the subsequent metallization layer as shown. Thus the n-type cathode of D10 is connected to ground while the metal anode of D11 is connected to the −V potential. The metal anode of D10 and the n-type cathode of D11 are connected to node B' as shown.

Figure 11:
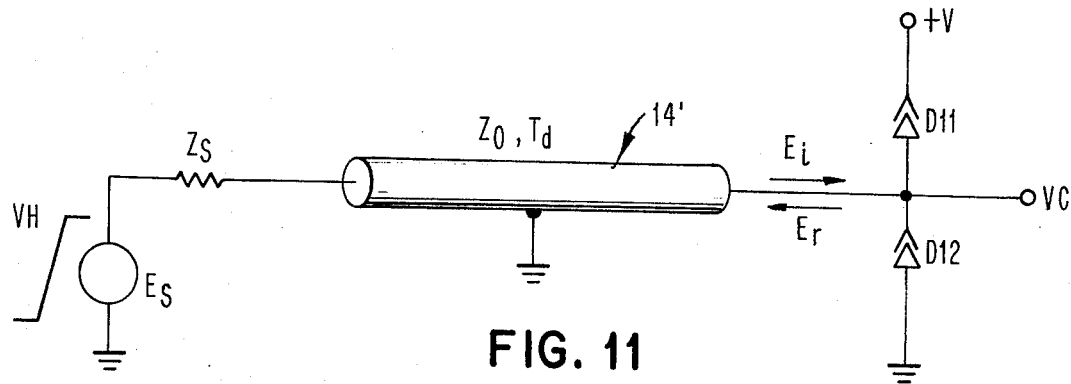
FIG. 11 is an equivalent circuit diagram of the FIG. 9 embodiment.

In FIG. 11 there is shown an equivalent circuit for that depicted in FIG. 9. The transistors T1 ad T2 together with associated circuit elements have been replaced with a potential source Es and an impedance Zs. Since the output of this equivalent circuit into the gate of transistor 16' is essentially an open circuit termination, it has been shown as such. The potentials have been modified slightly so that the most negative potential is indicated as ground potential. This equivalent circuit is being illustrated to assist with the description of the operation of the herein invention.

Operation

Figure 3:
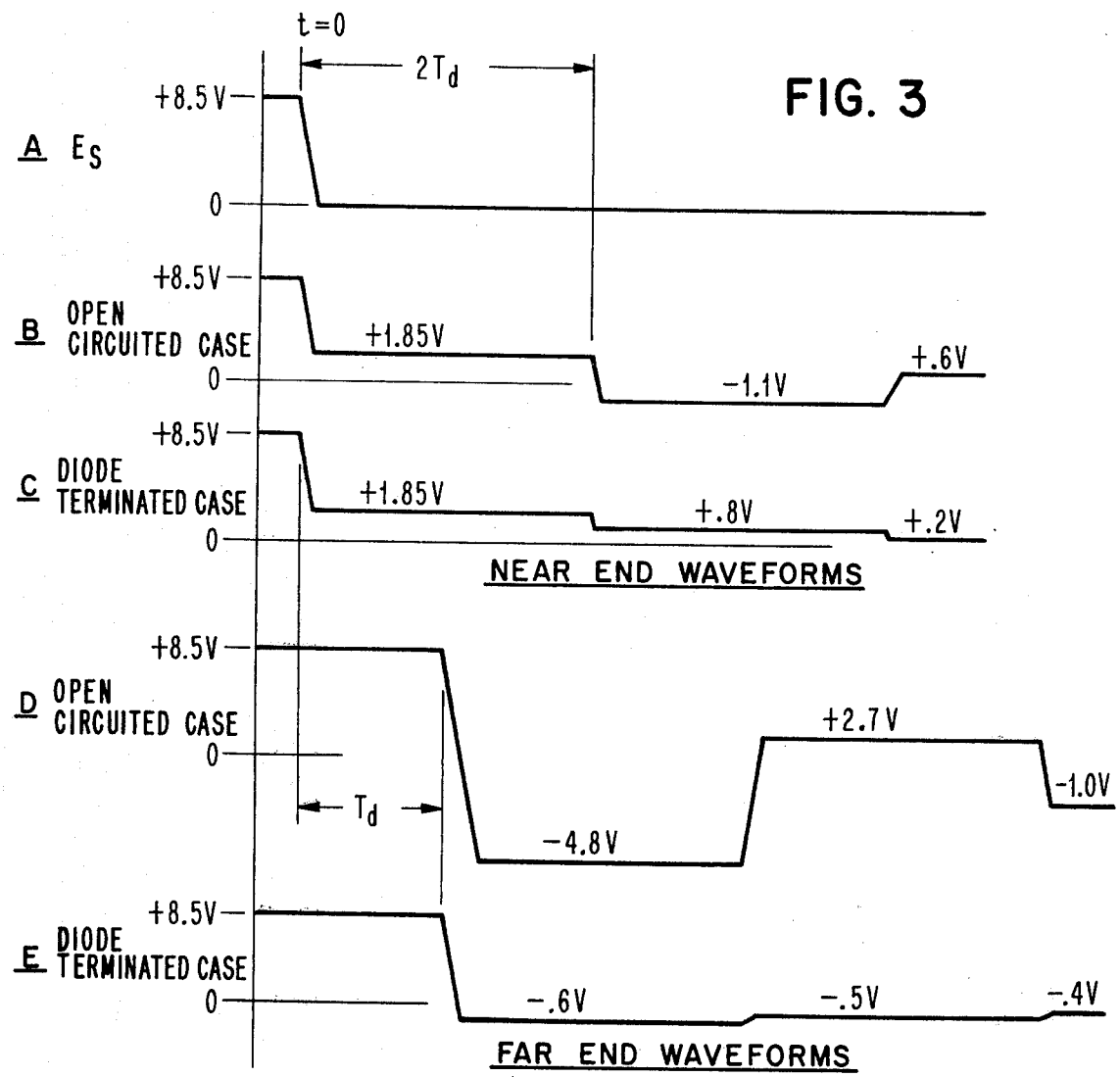
FIG. 3 is a series of wave form diagrams illustrative of the operation of the FIG. 1 circuit both with and without the improvement of FIG. 2.

Referring back to FIGS. 1 and 2, also refer to FIG. 3 for a description of the operation of the present invention. By way of the present illustrative example, assume that +V equals 8.5 volts, the length of the transmission line Td equals 10 ns, the impedance Zs of the driving circuit (transistors 10 and 12) equals 25 ohms and the characteristic impedance Zo of the transmission line equals 90 ohms. Assume that the potential at the input terminal is initially at a down level and then brought to an up level at time $t=0$. This will cause transistor 12 to conduct bringing node A to a down level as illustrated in FIG. 3A. Ideally, the potential at node A would remain at 0 volts. As a practical matter, however, when a transition of 8.5 volts is applied to a transmission line having a characteristic impedance of 90 ohms through a source impedance of 25 ohms, a signal swing of 6.65 volts results. This is obtained by the formula for calculating an incident potential being equal to the product of the applied potential multiplied by:

$$Zo/Zo + Zs$$

Accordingly, as illustrated in FIGS. 3B and 7A, the potential at node A only drops to 1.85 volts. At the end of one time delay (10 nanoseconds) this negative going waveform arrives at the far end node F. For the open circuited case, the down going 6.65 volts is reflected from the effective open circuit causing a total down going potential of 13.3 volts which subtracted from the original 8.5 volt level of the transmission line results in −4.8 volts at the far end of the transmission line. The −6.65 volt negative going waveform arriving at the near end at time 2Td induces a +3.75 volt reflection which causes the input node to drop to −1.1 volt as illustrated in FIGS. 3B and 7A. It is noted that the near end is terminated in the 25 ohm impedance so that the reflection coefficient differs from that at the far end. The +3.75 volts impinging on the far end in conjunction with a +3.75 volt reflection causes the −4.8 volt level to rise to +2.7 volts as illustrated in FIGS. 3D and 7A. One transmission line length interval later, the 3.75 volt signal and the resultant −2.11 volt causes the near end reflection node to rise to +0.6 volts as illustrated in FIG. 3B. The purpose of the foregoing illustration is to point out not only the excessive noise ringing in the transmission line but the bringing of the input node below ground level to −1.1 volts. It was previously explained how this negative potential which effectively is applied at node A of the parasitic circuit of FIG. 6 is fatally detrimental to the overall operation of the circuit.

Figure 8A:
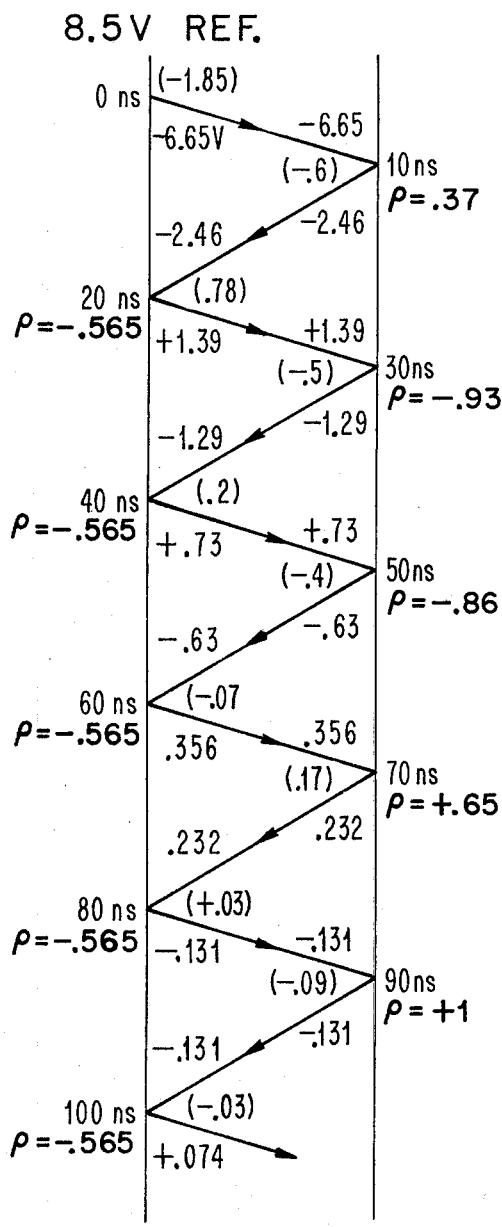
FIG. 8A is a voltage plot of a circuit incorporating the presently disclosed transmission line terminator.
Figure 8B:
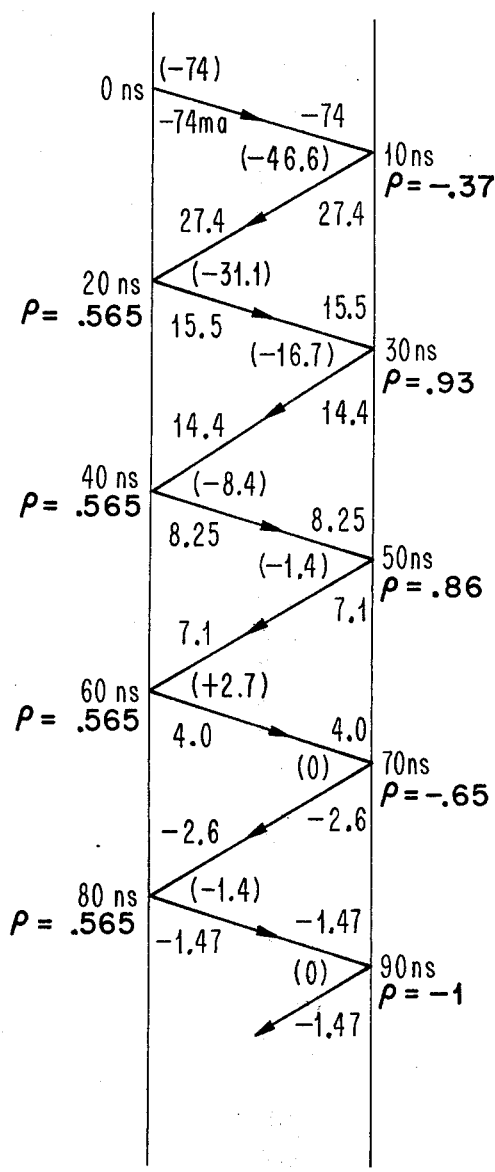
FIG. 8B is a current plot of a circuit incorporating the presently disclosed transmission line terminator.

With continued reference to FIG. 2, refer particularly to FIGS. 3C, 3E, and 8A which are the near end and far end waveforms for the diode terminator case of the present invention. At time $t=0$, the potential at the near end drops to 1.85 volts as shown in FIGS. 3C and 8A. As this waveform arrives at the far end, however, the reflected wave cannot pull the far end node to −4.8 volts. Rather, diode D2 begins to conduct permitting node B to only reach −0.6 volts, the forward diode drop of D2. When diode D2 conducts, the far end is no longer terminated in an open circuit, and the reflection coefficient is no longer equal to one. Thus, it is −2.46 volts that is reflected back to the near end causing a +1.39 volt near end reflection which causes the near end node A to drop to +0.8 volts as shown in FIGS. 3C and 8A. As further illustrated in the waveforms of FIG. 3C and 3E, node A (FIG. 3C) never drops below ground potential and the excessive noise and ringing occasioned by the open circuit terminator case is virtually eliminated.

Refer now to FIG. 11 for a further explanation of the operation of the present invention.

A transmission line that is characterized by characteristic impedance, ZO, and delay time, Td, is terminated by the non-linear diode-pair consisting of D11 and D12. When a positive transition of magnitude VH is applied to the line through a source impedance of Zs, an incident signal of:

$$Ei = VH (ZO)/Zo + Zs \qquad 1.$$

appears at the input. After one delay time transpires, this incident signal impinges upon the output. Since the diodes are off at that instant, the line attempts to generate a positive reflection of magnitude Ei. IF twice Ei exceeds the value Vc, diode D11 turns on and clamps the line at one diode drop above VH which is the value Vc. (Vc = VH + Vf diode). The forcing of the output voltage by the action of D11 causes a reflected voltage (Er) of specific value to be generated such that:

$$Er = Vc - Ei \qquad 2.$$

Dividing both sides of Eq. 2 by Ei yields:

$$Er/Ei = (Vc/Ei) - 1 \qquad 3.$$

The left side of Eq. 3 is the definition of the voltage reflection coefficient, pv. Restating Eq. 3, one gets:

$$pv = (Vc/Ei) - 1 \qquad 4.$$

Equation 4 is only valid when one of the diodes is conducting. Otherwise, the voltage reflection coefficient is give by standard transmission line theory as:

$$\rho v = (ZL - ZO)/ZL + Zo)$$

where ZL is the load impedance. At the near end, ZL is equal to Zs.

Although Eq. 4 was derived for the first reflection, it is also valid for all subsequent reflections. For subsequent reflections, the value of E$i$ changes but V$c$ remains approximately constant as long as the diode is conducting. Therefore, $\rho v$ will vary as E$i$ varies as shown in the reflection diagrams of FIGS. 7A, 7B, 8A and 8B.

With reference to FIGS. 7A, 7B, 8A and 8B a further analysis will help in describing the operation of the present invention.

In analyzing the transmission line with the diode terminator, some unexpected results occur. Specifically, one discovers that the far end reflection coefficient ($\rho$) varies with the magnitude of the far end voltage as long as one of the diodes is on. When one of the diodes is on, it is no longer the far end impedance that determines the magnitude of the reflected voltage. Instead, the diode sets the value of the far end voltage and the reflected voltage is such so as to maintain the diode set voltage. When both diodes are off, the transmission line behaves normally. The following discussion is intended to illustrate operation for the normal open circuited case and for the diode terminated case.

FIG. 7A denotes the voltage reflection diagram for the open circuited case. At time zero, an initial incident voltage (Eo) of $-6.65$ volts is applied to the line. After one 10ns delay time, the $-6.65$v wave reaches the far end and experiences a full positive reflection. The $-6.65$v reflected wave travels back to the near end and experiences a $-0.565$ fractional reflection. In the normal case, the fraction of reflected voltage ($\rho$ v) is given by the formula shown. In this formula, ZL is the load impedance at either the near end or the far end, depending upon the desired reflection coefficient to be calculated.

The value in parentheses at each end for each value of time is the resultant voltage on the line. This number is obtained by summing all of the incident and reflected voltages at each end of all previous time and subtracting the net from the starting voltage (8.5v).

FIG. 7B is the current reflection diagram. An initial incident current (Io) enters the line and experiences the opposite reflections that the voltage waveform experiences. This latter statement is also true for the diode terminated case.

The diode terminated case is shown in FIG. 8A. For 10–70ns at the far end, the diode is on. Note that during this time, the reflection coefficient varies considerably. After 70ns, the diode turns off and the line behaves as a normal open circuited line.

It can be shown that when the diode is ON, the reflection coefficient at the far end is given by:

$$\rho v = (Vc/Ei) - 1$$

where V$c$ is the voltage at which the far end is clamped and E$i$ is the incident voltage at the far end. For example, at 10ns in FIG. 8A.
$Vc = -0.6 - 8.5 = -9.1$ V. and E$i = -6.65$ V. so $$\rho v = (-9.1/-6.65) - 1 = 0.37$$

Since V$c$ remains approximately constant when the diode is ON, the reflection coefficient will change with each new E$i$.

The key point is that the diode terminated line operates according to a theory that is different from the resistive terminated theory.

The accured result is that the diodes keep the line operating within the same voltage bounds as a resistive termination without dissipating any DC power. Only the fundamental power required to charge the capacitance of the line is required. This AC power is:

$$\text{Energy/Time} = \tfrac{1}{2}CV^2/\text{Time} = \text{Power}$$

Note that the power is not a function of the diode or the near end resistance.

The operation of the present invention with a bipolar circuit is illustrated in FIG. 9.

The diodes form a voltage controlled non-linear terminator and operate identical to the diodes discussed for the complementary FET case. However, in the bipolar case terminator diode D11 prevents far end open circuit reflections from forward biasing the collector to isolation diode D13 associated with driving device T1. This condition is considered undesireable, since large leakage currents flow in the transistor substrate and hamper circuit operation. Also, this large negative transition will saturate transistor T1 and falsely turn-on transistor T2, which significantly increases the circuits power level. In addition, terminator diode D10 prevents a large transition above ground at the far end when driver device T2 charges the transmission line positive. If this positive transition is not clamped by D10, the gate of FET transistor 16 will be stressed by an abnormally large voltage.

While the invention has been particularly shown and described with reference to preferred embodiments thereof, it will be understood by those skilled in the art that various changes in form and detail may be made therein without departing from the spirit and scope of the invention.

What is claimed is:

1. An integrated circuit structure comprising:
    a semiconductor body;
    a first field effect transistor having source and drain regions of a first conductivity type formed in a semiconductor region of a second conductivity type within said body;
    a semiconductor region of said first conductivity type formed in said same semiconductor region of said second conductivity type is proximity to said first field effect transistor;
    a second field effect transistor having source and drain regions of the second conductivity type formed in the said semiconductor region of said first conductivity type, such that a parasitic bipolar transistor latch is formed in said semiconductor body, said bipolar transistor latch including three P-N junctions, the first P-N junction being formed by the source region of said first field effect transistor and the semiconductor region of the second conductivity type within the semiconductor body, the second P-N junction being formed by the semiconductor region of the second conductivity type within the semiconductor body and the semiconductor region of said first conductivity type formed in said same semiconductor region of said second conductivity type, the third P-N junction being formed by the semiconductor region of said first conductivity type formed in said same semiconductor region of said second conductivity type and the drain region of said second field effect transistor, said three P-N junctions being sufficiently closely spaced for transistor action;

a first potential source directly coupled to the source region of said first field effect transistor;

a second potential source directly coupled to the source region of said second field effect transistor;

a transmission line having a near end and a far end, a conductive path connecting the drain region of said first field effect transistor and the drain region of said second field effect transistor forming an output connected to the near end of said transmission line; and a pair of reverse biased terminator diodes connected in series and also connected to said transmission line for preventing reflected signals on said transmission line from setting said parasitic bipolar transistor latch.

2. An integrated circuit structure as in claim 1 wherein said transmission line comprises:

a near end connected to the output of said first and second field effect transistors and a far end, said terminator diodes being connected to the far end of said transmission line.

3. An integrated circuit structure as in claim 1 wherein:

a first of said pair of reverse biased terminator diodes is a Schottky diode with its cathode connected to said first potential source and its anode connected to the far end of said transmission line; and the second of said pair of reverse biased terminator diodes has its cathode connected to the far end of said transmission line, the anode of said second terminator diode being formed by a diffused region of said first conductivity type and directly coupled to said second potential source.

4. An integrated circuit structure as in claim 3 wherein:

said Schottky diode is formed by an annular conductor on a semiconductor region of said second conductivity type, said conductor forming the anode of the Schottky barrier diode, the cathode of said Schottky barrier diode being formed by said semiconductor material of said second conductivity type, contact to said cathode being made by means of a highly doped annular region formed by additional impurities of said second conductivity type in said same region of second conductivity type and concentric with said annular conductor;

the second of said pair of reverse biased terminator diodes being formed entirely within an area defined by said Schottky barrier diode.

5. An integrated circuit structure as in claim 4 wherein:

the second of said pair of reverse biased terminator diodes has its cathode formed by a highly doped region of second conductivity type formed within a region of said first conductivity type;

the anode of the second of said pair of reverse biased terminator diodes being formed by an annular region of said first conductivity type surrounding the cathode region.

* * * * *